(12) United States Patent
Inoue et al.

(10) Patent No.: US 9,216,609 B2
(45) Date of Patent: Dec. 22, 2015

(54) RADICAL ETCHING APPARATUS AND METHOD

(75) Inventors: Hiroaki Inoue, Shizouka (JP); Yasushi Higuchi, Shizuoka (JP); Michio Ishikawa, Shizuoka (JP)

(73) Assignee: ULVAC, INC., Kanagawa (JP)

( * ) Notice: Subject to any disclaimer, the term of this patent is extended or adjusted under 35 U.S.C. 154(b) by 0 days.

(21) Appl. No.: 13/981,277

(22) PCT Filed: Feb. 1, 2012

(86) PCT No.: PCT/JP2012/052301
§ 371 (c)(1),
(2), (4) Date: Jul. 23, 2013

(87) PCT Pub. No.: WO2012/108321
PCT Pub. Date: Aug. 16, 2012

(65) Prior Publication Data
US 2013/0306599 A1    Nov. 21, 2013

(30) Foreign Application Priority Data
Feb. 8, 2011 (JP) .................................. 2011-025462

(51) Int. Cl.
*B44C 1/22* (2006.01)
*H01J 37/32* (2006.01)
*H01L 21/311* (2006.01)

(52) U.S. Cl.
CPC ........... *B44C 1/227* (2013.01); *H01J 37/32192* (2013.01); *H01L 21/31116* (2013.01)

(58) Field of Classification Search
None
See application file for complete search history.

(56) References Cited

U.S. PATENT DOCUMENTS

| | | | |
|---|---|---|---|
| 5,866,986 A * | 2/1999 | Pennington | 315/111.21 |
| 8,119,530 B2 * | 2/2012 | Hori et al. | 438/694 |
| 2002/0025681 A1 * | 2/2002 | Chi et al. | 438/710 |
| 2002/0036066 A1 | 3/2002 | Ogawa et al. | |
| 2003/0116277 A1 * | 6/2003 | Chi et al. | 156/345.4 |

(Continued)

FOREIGN PATENT DOCUMENTS

| | | |
|---|---|---|
| JP | 08-306675 A | 11/1996 |
| JP | 2002-170813 A | 6/2002 |

(Continued)

OTHER PUBLICATIONS

International Search Report, International Application No, PCT/JP2012/052301, mailing date May 1, 2012.

*Primary Examiner* — Allan Olsen
(74) *Attorney, Agent, or Firm* — Arent Fox LLP (57) ABSTRACT

A radical etching apparatus comprising a vacuum chamber for a substrate to be treated; a pipe pathway, connected to the vacuum chamber, a zone for generating plasma and a gas introduction device through which $N_2$ and at least one of $H_2$ and $NH_3$ can be introduced; a microwave applying microwaves to the interior of the pipe pathway; a gas introducer as a source of supply for F, between the vacuum chamber and the zone; and a shower plate. A method comprises introducing $N_2$ and at least one of $H_2$ and $NH_3$ into a pipe pathway and applying microwaves. The gas mixture is decomposed by the plasma forming decomposition products as active species which react with F during transportation to the vacuum chamber to make radicals. An $SiO_2$ layer on the substrate etched in the vacuum chamber, by irradiating the substrate with the radicals through the shower plate.

4 Claims, 5 Drawing Sheets

(56) References Cited

U.S. PATENT DOCUMENTS

| | | | |
|---|---|---|---|
| 2005/0150861 A1* | 7/2005 | Lee et al. | 216/2 |
| 2005/0153553 A1 | 7/2005 | Lee et al. | |
| 2005/0257890 A1* | 11/2005 | Park et al. | 156/345.35 |
| 2006/0157079 A1* | 7/2006 | Kim et al. | 134/1.1 |
| 2006/0205190 A1* | 9/2006 | Chi et al. | 438/507 |

FOREIGN PATENT DOCUMENTS

| | | |
|---|---|---|
| JP | 2005-203408 A | 7/2005 |
| JP | 2010-165954 A | 7/2010 |

* cited by examiner

RADICAL ETCHING APPARATUS AND METHOD

CROSS-REFERENCED TO RELATED APPLICATION

This application is a National Stage entry of International Application PCT/JP2012/052301, filed Feb. 1, 2012, which claims priority to Japanese Application No. 2011-025462, filed Feb. 8, 2011, the disclosure of the prior applications are hereby incorporated in their entirety by reference.

TECHNICAL FIELD

The present invention relates to a radical etching apparatus and a radical etching method and in particular to a radical etching apparatus and a radical etching method, which principally make use of HF radicals as an etchant.

BACKGROUND ART

In the process for manufacturing an Si transistor, there has conventionally been used a step of washing a substrate to be treated with an HF solution for the removal of the naturally-occurring oxide film present on the surface of the substrate, as a preliminary step for forming salicide composed of Ni and Co for ensuring the contacts between the sources or drains of the transistor and the distributing wires or interconnections thereof and also as a preliminary step for ensuring the contact between the gate poly-Si films and the distributing wires or interconnections of the transistor. However, such an HF solution cannot satisfactorily enter into the fine holes of the device as the latter undergoes gradual shrinkage with the elapse of time and accordingly, the naturally-occurring oxide film cannot sufficiently be removed.

To solve the aforementioned problems, a radical etching technique (CDT) in a gaseous phase has recently been used, which makes use of NFH radicals ($NF_xH_y$ radicals) such as $NF_2H$ or $NFH_2$ radicals. When carrying out the removal of an $SiO_2$ film through etching procedures with the use of NFH radicals, $(NH_4)_2SiF_6$ is formed as a residue product. The removal of this residue product has in general been carried out through evaporation, while heating the product to a temperature on the order of 200° C. This method for the removal of $(NH_4)_2SiF_6$ as the residue product makes the most use of the characteristic properties peculiar to the same such that it can be vaporized at a temperature of about 120° C. To form NFH radicals, there has been used such a method which comprises the steps of decomposing $N_2$ gas and $H_2$ gas or $NH_3$ gas by the irradiation of the gas with the plasma generated by the application of microwaves (hereunder referred to as "µ waves") to thus form H radicals; introducing the resulting H radicals into a vacuum chamber; and then allowing the H radicals to undergo a reaction with $NF_3$ separately introduced into the vacuum chamber (see, for instance, Patent Document 1 as will be specified below). The generation of a plasma through the use of µ waves has been carried out by introducing $N_2$ gas and $H_2$ gas or $NH_3$ gas into a quartz tube or a sapphire tube and then irradiating the gas mixture with µ waves. However, the lifetime of the H radicals thus produced is quite short and a problem correspondingly arises such that it is quite difficult to transport the H radicals to a vacuum chamber without any deactivation of the same.

Conventionally, the formation of $NF_xH_y$ radicals has been accelerated by controlling the direct formation of HF while taking care not to cause any direct irradiation of $NF_3$ with plasma or ions and the $NF_xH_y$ radicals thus generated have been used for the etching of $SiO_2$. In this case, the related reaction formulas (1) to (3) will be those described below (according to the NFH etching mode):

$$SiO_2+6NFH_2+6H_2 \rightarrow (NH_4)_2SiF_6+2H_2O+4NH_3 \quad (1)$$

$$SiO_2+NFH+5HF+NH_3+H_2+H \rightarrow (NH_4)_2SiF_6+2H_2O \quad (2)$$

$$SiO_2+2NH_4^++2HF_2^-+2HF \rightarrow (NH_4)_2SiF_6+2H_2O \quad (3)$$

However, if HF radicals directly reach a layer of $SiO_2$, the direct etching of the $SiO_2$ layer with HF proceeds as will be illustrated by the following reaction formulas (4) and (5), in addition to the foregoing three reactions (according to the HF etching mode):

$$SiO_2+4HF \Leftrightarrow 2H_2O+SiF_4:SiF_4+2HF \Leftrightarrow H_2SiF_6 \quad (4)$$

$$SiO_2+6HF \Leftrightarrow 2H_2O+H_2SiF_6 \quad (5)$$

In respect of the reactions according to the foregoing reaction formulas (4) and (5), the reactions according to the following reaction formulas (6) and (7) take place simultaneous with the reactions represented by the formulas (4) and (5), unlike the foregoing reactions represented by the reaction formulas (1) to (3), in which NFH radicals are involved, the reactions according to the formulas (6) and (7) are correspondingly accompanied by the generation of a large quantity of F and, in this case, the etching of the $SiO_2$ layer would proceed according to the F etching mode. For this reason, this would arise a problem such that the $SiN_x$ film on a semiconductor device is likewise etched in some cases.

$$N+NF_3 \rightarrow N=NF_3 \rightarrow N=NF_2+F \quad (6)$$

$$N+NF_3+N \rightarrow N=NF_2+NF:NF+N \rightarrow N_2+F \quad (7)$$

However, this reaction, in which HF is involved, is advantageous in that the reaction is not accompanied by any self-stopping effect or it is never terminated autonomously and that the etching rate thereof is very high unlike the reactions in which $NF_xH_y$ radicals are involved. Therefore, a thick film can be etched at a high speed if it is not necessary to take into consideration the selectivity ratio with respect to the etching of a thermally deposited-nitride film (SiN film).

PRIOR ART LITERATURE

Patent Document

Patent Document 1: Japanese Un-Examined Patent Publication No. 2010-165954

DISCLOSURE OF THE INVENTION

Problems that the Invention is to Solve

It is a problem of the present invention to solve the foregoing problems associated with the conventional techniques. More specifically, it is a problem of the present invention to provide an apparatus and a method for radical etching, which permit the practice of etching procedures according to the HF mode and the etching of a thick film (for instance, one having a thickness of not less than 100 nm) at a high etching speed, or the removal of a thick film. Contrary to this, in the case of the conventional etching with the use of only NFH radicals, the upper limit of the etching process was only about 8 nm as expressed in terms of the film thickness.

Means for the Solution of the Problems

The radical etching apparatus according to the present invention is composed of a vacuum chamber in which a substrate to be treated is placed; a pipe pathway, which is connected to the vacuum chamber, has a zone for generating plasma and is provided with a gas introduction means through which $N_2$ gas and at least one member selected from the group consisting of $H_2$ gas and $NH_3$ gas can be introduced into the pipe pathway; a microwave application means which permits the application of microwaves to the interior of the pipe pathway; a gas introduction means for introducing a gas as a source of supply for F, which is provided in the course of the pipe pathway and arranged between the vacuum chamber and the zone for generating the plasma; and a shower plate arranged within the vacuum chamber.

According to an embodiment of the present invention, the foregoing radical etching apparatus is characterized in that the substrate to be treated is provided with an $SiO_2$ layer on the surface thereof and in which the $SiO_2$ layer present on the substrate is removed through a radical etching treatment.

According to another embodiment of the present invention, the foregoing radical etching apparatus is characterized in that the gas as the source of supply for F is at least one member selected from the group consisting of $NF_3$ gas, HF gas and $F_2$ gas.

According to still another embodiment of the present invention, the foregoing radical etching apparatus is characterized in that a further gas introduction means for introducing, into the vacuum chamber, a gas as a source of supply for F is arranged within the vacuum chamber.

According to an embodiment of the present invention, the foregoing radical etching apparatus, in which the vacuum chamber is provided with a further gas introduction means for introducing, into the vacuum chamber, a gas as a source of supply for F, is characterized in that the substrate to be treated is provided with an $SiO_2$ layer on the surface thereof and in which the $SiO_2$ layer is removed through a radical etching treatment.

According to another embodiment of the present invention, the foregoing radical etching apparatus, which is provided with a further gas introduction means for introducing, into the vacuum chamber, a gas as a source of supply for F, is characterized in that the gas as the source of supply for F is at least one member selected from the group consisting of $NF_3$ gas, HF gas and $F_2$ gas.

The radical etching method according to the present invention is characterized in that it comprises the steps of introducing $N_2$ gas and at least one member selected from the group consisting of $H_2$ gas and $NH_3$ gas into a pipe pathway provided with a zone in which plasma is to be generated; applying microwaves to the gas mixture within the zone so that plasma is thus generated and that the gas mixture is decomposed by the action of the plasma thus generated to thus form decomposition products as active species; irradiating the decomposition products with a gas as a source of supply for F in the middle of the transportation of the decomposition products to a vacuum chamber so that the decomposition products undergo a reaction with the source of supply for F and radicals thereof are thus generated; and subjecting an $SiO_2$ layer formed on a substrate to be treated, which has been placed within the vacuum chamber, to radical etching by irradiating the substrate to be treated with the radicals through a shower plate arranged within the chamber.

According to an embodiment of the radical etching method of the present invention, it is characterized in that the gas as the source of supply for F is at least one member selected from the group consisting of $NF_3$ gas, HF gas and $F_2$ gas.

According to another embodiment of the radical etching method of the present invention, it is characterized in that the decomposition products are principally composed of H radicals and H ions and the radicals formed through the reaction of the decomposition products and the gas as the source of supply for F are mainly composed of HF radicals.

According to still another embodiment of the radical etching method of the present invention, it is characterized in that the etching reaction is exclusively caused by the action of the HF formed through the reaction of the decomposition products and the gas as the source of supply for F, while the etch selectivity of a thermally deposited-nitride film with respect to that of a thermally deposited-oxide film or an $SiO_2$ film is not higher than 1.0.

Effects of the Invention

In the apparatus and method of the present invention, the etching is carried out according to the HF mode and this in turn permits the achievement of such an effect that a thick film can be etched at a high speed. More specifically, in the case of the conventional etching technique with the use of only NFH radicals, the upper limit of the thickness of a film removed by the etching process (the limit in the etch thickness) is only about 8 nm, while the etching of the present invention according to the HF mode would permit the removal of even a film thickness of not less than 100 nm (etch thickness).

MODE FOR CARRYING OUT THE INVENTION

According to an embodiment of the radical etching apparatus of the present invention, the radical etching apparatus comprises a vacuum chamber in which a substrate to be treated and provided thereon with an $SiO_2$ layer such as a sacrificial layer is placed; a pipe pathway, which is connected to the vacuum chamber, has a zone for generating plasma and is provided with a gas introduction means through which $N_2$ gas and at least one member selected from the group consisting of $H_2$ gas and $NH_3$ gas can be introduced into the pipe pathway; a microwave application means which permits the application of microwaves to the interior of the pipe pathway or the zone thereof for the generation of plasma; a gas introduction means for a gas as a source of supply for F which is at least one member selected from the group consisting of $NF_3$ gas, HF gas and $F_2$ gas, which is provided in the pipe pathway and arranged between the vacuum chamber and the zone for generating the plasma; and a shower plate arranged within the vacuum chamber. The radical etching apparatus is used for subjecting, to an etching treatment, the $SiO_2$ layer formed on the substrate to be treated.

The aforementioned radical etching apparatus may be a batch type one which can simultaneously treat a plurality of substrates to be processed, or a sheet-fed type (or a sheeter type) one which can treat one substrate at a time.

In a still another embodiment of the foregoing radical etching apparatus, the apparatus or the vacuum chamber is further provided with a gas introduction means for introducing a gas as a source of supply for F within the vacuum chamber.

According to an embodiment of the radical etching method of the present invention, the method comprises the steps of introducing $N_2$ gas and at least one H radical-generation gas selected from the group consisting of $H_2$ gas and $NH_3$ gas into a pipe pathway provided with a zone in which plasma is to be generated; applying microwaves to the gas mixture introduced into the pipe pathway so that plasma is thus generated and that the gas mixture introduced into the pipe pathway is decomposed and polymerized by the action of the plasma thus generated to thus form ions and/or radicals such as H, N, NH, $NH_2$, $N_2H$, $N_3H$, and $N_2H_4$; allowing the ions and/or radicals to react with at least one gas as a source of supply for F (fluorine atom-containing gas) selected from the group consisting of $NF_3$ gas, HF gas and $F_2$ gas, in the middle of the transportation of the ions and/or radicals to a vacuum chamber in order to form ions and/or radicals of F, HF and $NF_xH_y$ (x=1 to 3, y=1 to 4) which can serve as an etchant; and irradiating a substrate to be treated, which is arranged within the vacuum chamber, with the ions and/or radicals of F, HF and $NF_xH_y$ thus produced by the foregoing reaction and guided to the surface of the substrate through a shower plate disposed within the vacuum chamber so that the $SiO_2$ formed on the substrate is subjected to radical etching. At this stage, the active species having the shortest lifetime are H radicals (in this connection, the lifetime of H ions is shorter than that of the H radicals, but the H ions may often maintain their radical state even if the H ions are neutralized and therefore, it would be sufficient to take into consideration only the H radicals) and accordingly, the H radicals should be reacted with the fluorine atom-containing gas before they are collide with the wall of, for instance, the pipe pathway or they are returned to or converted into $H_2$ molecules through any possible gas-phase reaction. In this respect, NH and $NH_2$ are stable and never undergo such a reaction. Moreover, it has been known that $N_2H$, $N_3H$ and $N_2H_4$ are decomposed to generate H radicals.

As the foregoing $NF_xH_y$ (x=1 to 3, y=1 to 4) radicals, there can be listed, for instance, $NF_2H$ and $NFH_2$ radicals.

According to the radical etching method of the present invention, the etching reaction exclusively takes place by the action of HF as a reaction product of the foregoing decomposition products and the gas as the source of supply for F, but the etch selectivity ratio of a thermally deposited nitride film (SiN film) to a thermally deposited oxide film ($SiO_2$ film) on the semiconductor device is not higher than 1.0.

Figure 1:
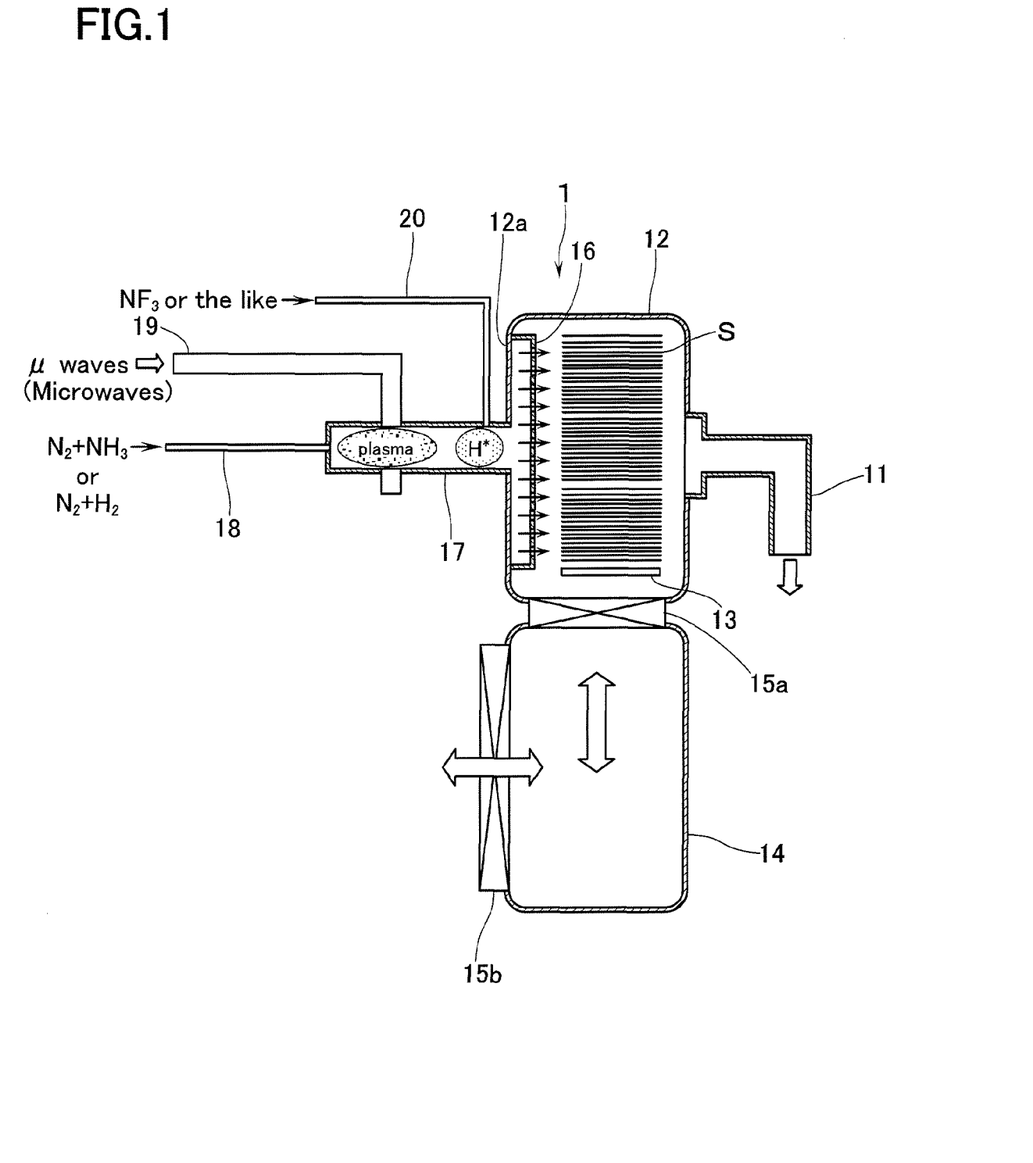
FIG. 1 is a schematic cross sectional view showing an embodiment which illustrates the construction of the radical etching apparatus according to the present invention.
Figure 2:
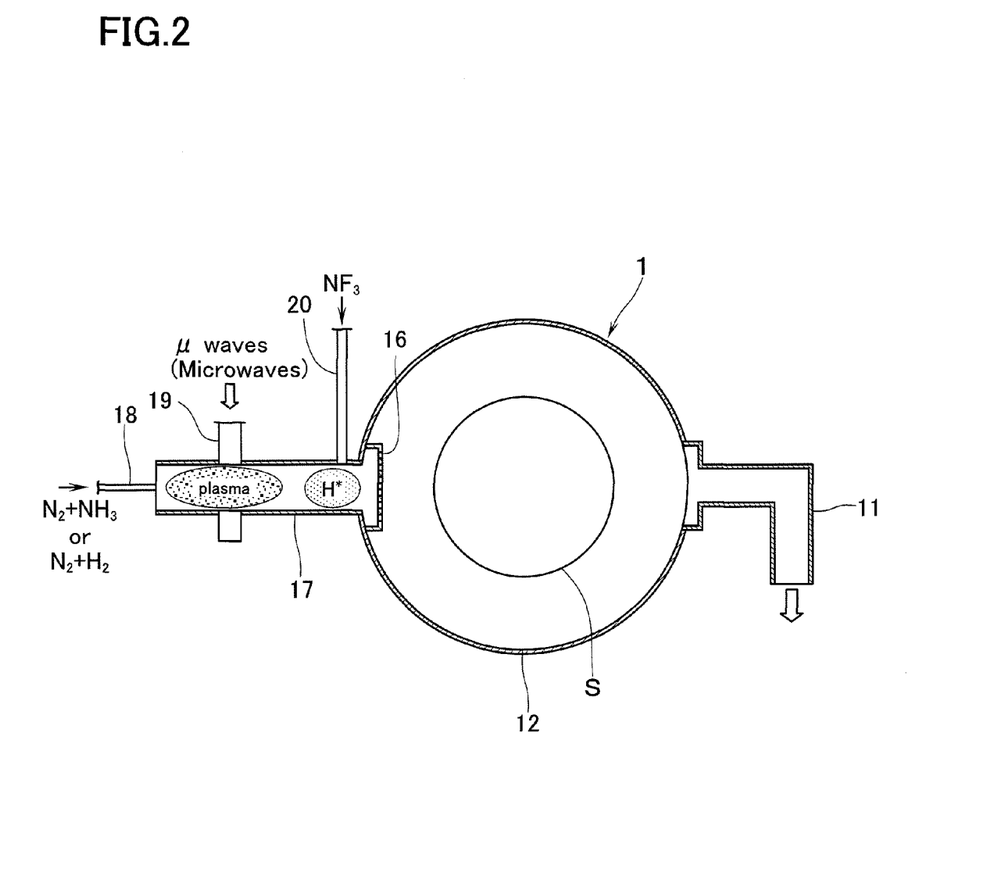
FIG. 2 is a schematic top plan view of the radical etching apparatus as shown in FIG. 1.
Figure 3:
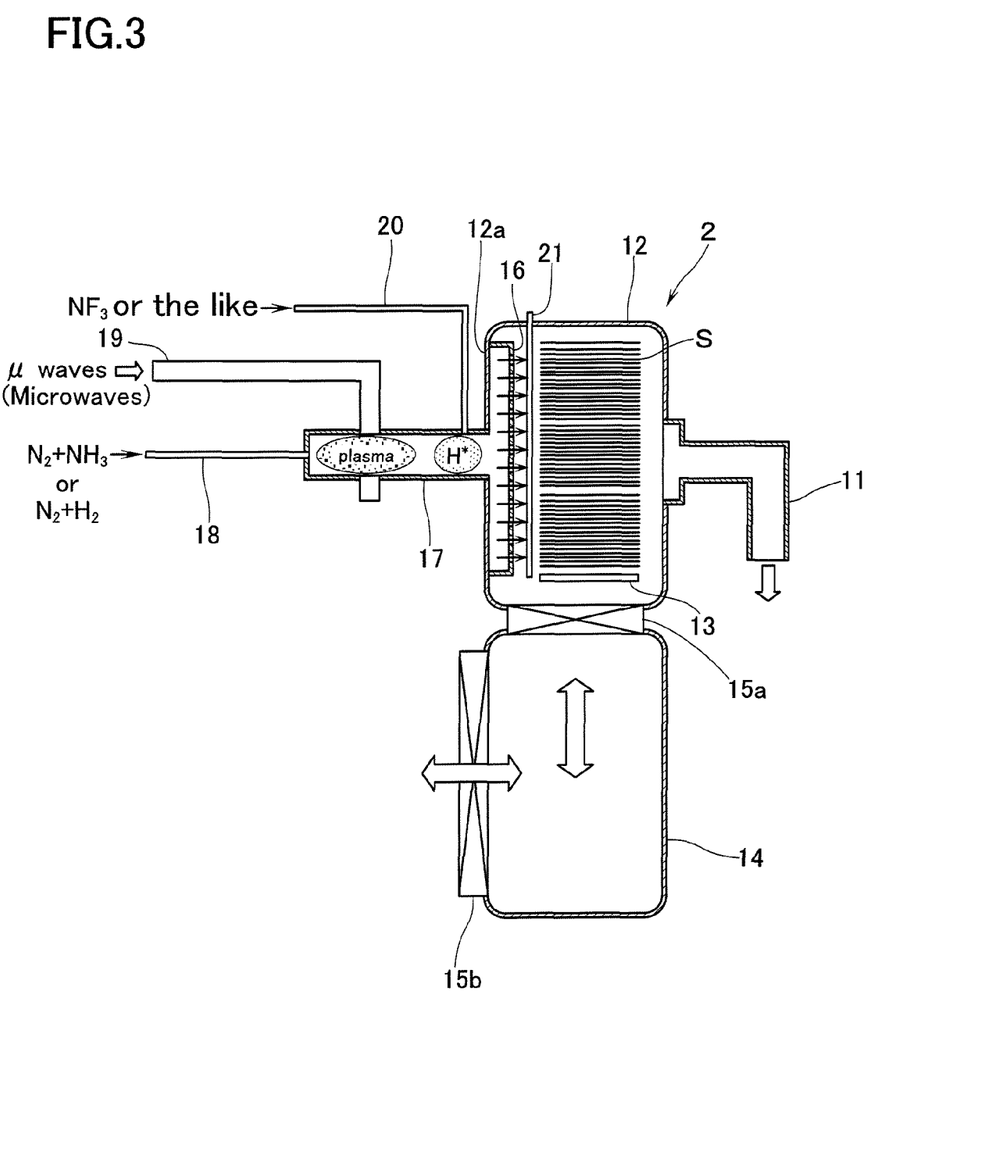
FIG. 3 is a schematic cross sectional view showing another embodiment which illustrates the construction of the radical etching apparatus according to the present invention.

Specific embodiments of the radical etching apparatus according to the present invention will hereunder be described in more detail with reference to the accompanying drawings 1 to 3. In this respect, FIG. 1 is a schematic cross sectional view showing an embodiment which illustrates an exemplary construction of the radical etching apparatus according to the present invention; FIG. 2 is a schematic top plan view of the radical etching apparatus as shown in FIG. 1; and FIG. 3 is a schematic cross sectional view showing another embodiment which illustrates the construction of the radical etching apparatus according to the present invention. In FIGS. 1 to 3, all the structural elements, which are identical to one another, bear the same reference numerals.

According to the exemplary construction of the radical etching apparatus of the present invention as shown in FIGS. 1 and 2, this radical etching apparatus 1 is provided with a vacuum chamber 12 whose interior can be made vacuum by exhausting the same with a vacuum evacuation system 11 and the interior of the vacuum chamber 12 is so designed that a boat 13 can be arranged therein, on which a predetermined number of substrates S to be treated (for instance, fifty Si wafers) can be placed. Further, the radical etching apparatus is likewise so designed that a chamber 14 for charging substrates S to or withdrawing them from the vacuum chamber is connected to the bottom portion of the vacuum chamber 12 through a gate valve 15a and that the substrates S to be treated, which are contained in the charging and withdrawing chamber 14 can be transferred to the interior of the vacuum chamber 12 by opening the gate valve 15a. In addition, a boat 13 is brought into the charging and withdrawing chamber 14 through a gate valve 15b which isolates the charging and withdrawing chamber from the external atmosphere, while the boat is provided thereon with a predetermined number of substrates to be treated. Moreover, a shower plate 16 is arranged within the vacuum chamber 12 so that radicals used for etching can uniformly be distributed over the surface of the substrate S to be treated.

A pipe pathway 17 composed of, for instance, quartz and having a zone for the generation of plasma is arranged, on the side wall 12a of the vacuum chamber 12, in such a manner that it is opposed to the shower plate 16. A gas introduction means 18 is disposed at the inlet of the pipe pathway 17 opposite to the vacuum chamber 12 and this permits the introduction of $N_2$ gas and at least one gas for generating H-plasma selected from the group consisting of $H_2$ gas and $NH_3$ gas into the pipe pathway. The pipe pathway 17 is also provided with, at the upstream side thereof, a means 19 for applying microwaves which is arranged at the position corresponding to the plasma-generation zone and a gas introduction means 20 is arranged between the side wall 12a of the vacuum chamber 12 and the plasma-generating zone within the pipe pathway 17 so that at least one gas as a source of supply for F selected from the group consisting of $NF_3$ gas, HF gas and $F_2$ gas can be introduced into the vacuum chamber 12. This gas introduction means 20 should be arranged at a position where the H radicals transported from the plasma-generating zone still maintain their activities so that the H radicals can react with the fluorine atom-containing gas before the H radicals are collide with the wall of, for instance, the pipe pathway or they are returned to or converted into $H_2$ molecules through any possible gas-phase reaction.

The gas introduced into the pipe pathway 17 through the foregoing gas introduction means 18 is irradiated with microwaves generated by the microwave application means (or microwave-irradiation means) 19 to thus form plasma; then the gas introduced into the pipe pathway is decomposed by the action of the plasma to form, for instance, H radicals; the H radicals are irradiated with $NH_3$ gas and a gas as a source of supply for F introduced through the gas introduction means 20 in the middle of the transportation of the H radicals together with $N_2$ gas to the vacuum chamber 12 to thus form, for instance, H radicals, F radicals, HF radicals, $NF_2$ radicals and $NF_xH_y$ (x=1 to 3, y=1 to 4) radicals, or principally HF radicals; these radicals are immediately fed to the surface of a substrate S to be treated through the shower plate 16 arranged within the vacuum chamber 12 to thus remove the sacrificial layer of $SiO_2$ formed on the substrate S to be treated through etching.

Then another embodiment of the radical etching apparatus according to the present invention will hereunder be described in more detail with reference to FIG. 3 hereto attached.

The apparatus 2 depicted in this figure is similar to the apparatus 1 as shown in FIG. 1 except that a gas introduction means 21 for the introduction of a gas as a source of supply for F is additionally disposed behind the shower plate 16 arranged within the vacuum chamber 12 and this may accordingly permit the further improvement of the etching rate. In respect of various structural elements as shown in FIG. 3, all the structural elements which are identical to those shown in FIGS. 1 and 2, bear the same reference numerals, as has already been described above and accordingly, the details thereof will be omitted herein.

Next, the radical etching method using the aforementioned radical etching apparatus according to the present invention will hereunder be described in detail.

Using the radical etching apparatus as shown in FIGS. 1 and 2, the valve 15b which isolates the internal atmosphere of the charging and withdrawing chamber 14 from the external atmosphere is opened and the boat 13 is brought into the vacuum chamber 14 while it is provided thereon with a predetermined number (for instance, 50) of substrates S to be treated such as Si wafers. Using a vacuum evacuation system 11, the vacuum chamber 12 is evacuated to a desired degree of vacuum or pressure and then the valve 15a is opened so that the Si wafers S are brought into the vacuum chamber 12 (reaction chamber). Subsequently, the Si wafers S are irradiated with an etchant through the shower plate 16 to thus initiate a desired etching process. The etching procedures are as follows: For instance, 5 slm of $N_2$ gas and 0.9 slm of $NH_3$ gas are introduced into the pipe pathway through the gas introduction means 18; microwaves (for instance, 2.45 GHz) are applied to the gas mixture within the pipe pathway through the microwave-irradiation means 19 to thus generate electric discharge in the plasma-generation zone within the applicator (pipe pathway 17) and to thereby generate plasma; then the gas introduced therein is decomposed by the action of the plasma thus generated to thus form ions and/or radicals such as H ions and H radicals; the ions and/or radicals thus formed are subsequently transported to the vacuum chamber 12; appropriate quantities of $NH_3$ gas and at least one gas as a source of supply for F selected from the group consisting of $NF_3$ gas, HF gas and $F_2$ gas are introduced into the pipe pathway in the middle of the transportation of these ions and/or radicals through the gas introduction means 20 to thus combine these gases with the H ions and H radicals transported from the upstream of the pipe pathway and to allow the former to react with the latter; and finally the substrates S to be treated, which are transported to and arranged within the vacuum chamber 12 are uniformly irradiated with the etchant thus generated and transported to the chamber 12, through the shower plate 16. In this respect, the vacuum chamber 12 has been evacuated to a predetermined pressure by the operation of the evacuation system 11 connected to the vacuum chamber and positioned opposite to the shower plate 16. After the completion of the etching process over a predetermined period of time, the substrates S to be treated are heated up to a temperature of 200° C. using a lamp heater (not shown in the figures) to remove the reaction products formed through the etching process. In this connection, the reaction products principally produced during the etching (the reaction products) are $(NH_4)_2SiF_6$, $H_2SiF_6$ and $H_2O$. It has been known that these reaction products can be removed if they are heated at a temperature of 200° C.

Regarding the foregoing etching pressure, Examples given below demonstrated that it in general ranges from 200 to 1,000 Pa, preferably 300 to 1,000 Pa and more preferably 400 to 700 Pa and, as a whole, the etching procedures can be implemented at a pressure falling within the range specified above.

In the case of the radical etching apparatus as shown in FIG. 3, it would be sufficient that the desired etching process is implemented according to the same procedures described above in connection with FIGS. 1 and 2. In this respect, however, appropriate quantities of $NH_3$ gas and at least one gas as a source of supply for F selected from the group consisting of $NF_3$ gas, HF gas and $F_2$ gas are introduced, through the gas introduction means 21, into the etchant which is introduced into the vacuum chamber 12, the resulting mixture is then irradiated with the radicals or the like transported from the upstream of the pipe pathway to the vacuum chamber through the shower plate 16 and the substrates S to be treated, which are placed in the vacuum chamber 12 are uniformly irradiated with the etchant. Thus the etching rate of the surface of the substrate would correspondingly be improved.

The present invention thus permits the implementation of the etching process according to the HF mode etching and this HF mode etching allows the etching of a thick film at a high speed if it is not necessary to take into account any difference in etch selectivity between a thermally deposited nitride film and an $SiO_2$ film, in other words, unless any thermally deposited nitride film is present on the surface of a device. Conventionally, due consideration has been given not to form any HF molecules during the etching process. Contrary to this, HF molecules are formed positively in the method of the present invention and this in turn permits the etching of even a thick film. Accordingly, it is necessary to think seriously upon the arrangement of the gas introduction means such that the H radicals, H ions or the like generated through the plasma-decomposition are allowed to collide with fluorine atom-containing gas such as $NF_3$ and $F_2$ gas before the H radicals, H ions or the like are disappeared due to the collision thereof with, for instance, the wall of the pipe pathway for transportation to thus efficiently form HF molecules. Specifically, it has been common that $NF_3$ gas is not directly applied to H radicals, but is introduced into the vacuum chamber, in which substrates are positioned, separately from the H radicals. However, the etching process can be implemented according to the HF mode if $N_2$ gas is combined with H radicals and H ions at the position between the plasma generation zone and the vacuum chamber and in the proximity to the former, before H radicals or the like are introduced into the vacuum chamber together with the $N_2$ gas. The radical etching apparatus according to the present invention whose constructions are exemplified in FIGS. 1 to 3 is so designed that it has such a construction discussed above. More specifically, $NF_3$ gas or the like is introduced into the pipe pathway through the gas introduction means 20 positioned immediately behind the plasma generation zone. Subsequently, the $NF_3$ gas undergoes a reaction with the H radicals and/or H ions and the reaction product in the form of HF thus formed are introduced into the vacuum chamber 12. It is a matter of course that $NF_xH_y$ radicals are also formed during the foregoing reaction and accordingly, the reactions represented by the foregoing reaction formulas (1) to (3) likewise take place at the same time. If $NF_3$ gas or the like is directly introduced into the plasma generation zone, however, the inner wall of the pipe pathway composed of SiO$_2$ or the like which is used for the generation of plasma may be etched and accordingly, the apparatus of the present invention is so designed that any NF$_3$ gas never enters into the plasma.

When etching an SiO$_2$ film according to the HF mode, it has been recognized that the upper most phase of the surface of a substrate, which has a thickness corresponding to several atoms is converted into a liquid phase or the upper most phase of the SiO$_2$ film is converted into its HF: OH state, while the etching procedure proceeds. At this stage, as the characteristic properties of HF in its gaseous form, the thickness and concentration of the liquid phase increase if the HF concentration increases and accordingly, the etching speed is likewise increased. Moreover, the concentration of H$_2$SiF$_6$, which has an effect of self-stopping the etching process, is diluted if the thickness of the liquid layer increases and as a result, the self-stopping effect may become ineffective. The H$_2$SiF$_6$ produced during the reaction is a liquid, but it can evaporate at a temperature of 110° C. and, for this reason, it would be disappeared along with the evaporation of (NH$_4$)$_2$SiF$_6$. In other words, the etching rate can be improved as the HF concentration is increased and the etch thickness can likewise be increased.

The present invention will hereunder be described in more specifically with reference to the following working Examples.

EXAMPLE 1

In this Example, a radical etching apparatus shown in FIG. 1 or 2 was used and 10 slm of N$_2$ gas and 0.9 slm of NH$_3$ gas were fed to the pipe pathway of the apparatus through the gas introduction means 18, the electric power for applying μ waves was set at a level of 2.5 kW, and 0.8 slm of NH$_3$ gas and 1.0 slm of NF$_3$ gas were fed thereto through the gas introduction means 20.

Then a thermally deposited or formed oxide film or SiO$_2$ layer formed on a substrate S (Si wafer) to be treated was removed through etching while variously changing the etching time periods within the range of from 5 to 50 minutes at an etching pressure of 100 Pa, 400 Pa and 700 Pa, respectively to thus determine the relation between the etching time period and the degree of etching of the SiO$_2$ layer (or etch thickness: nm). The results thus obtained are plotted on FIG. 4.

Figure 4:
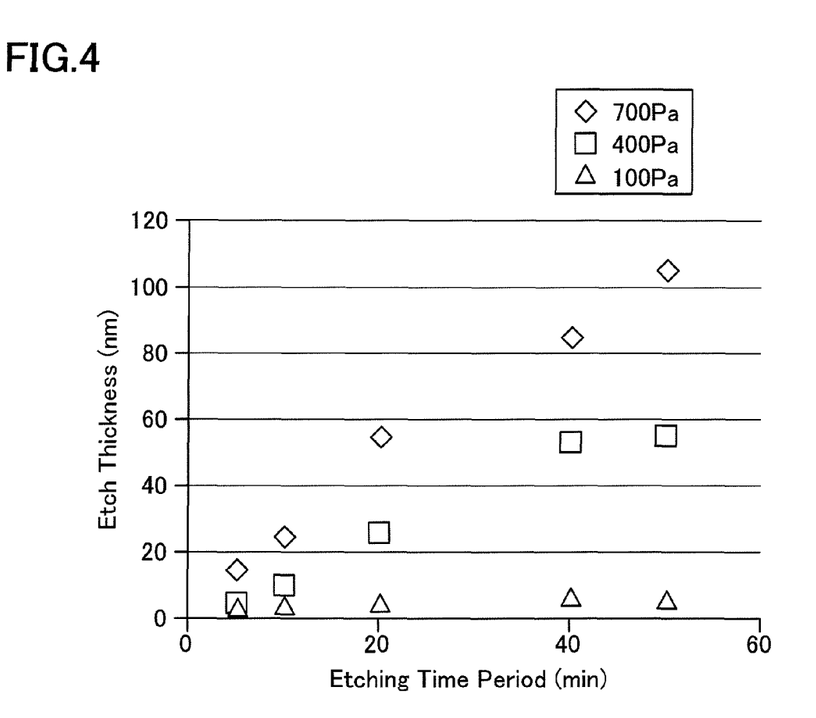
FIG. 4 is a graph showing the relation between the etching time period (minute) and the etching rate (etch thickness (unit: nm)) observed at each predetermined pressure and obtained in Example 1.

The data plotted on FIG. 4 clearly indicates that when the etching procedures were continued over 50 minutes, the etch thickness was found to be only 8 nm at the etching pressure of 100 Pa, while it was found to be a little less than 60 nm at the etching pressure of 400 Pa and it was found to be even 108 nm at the etching pressure of 700 Pa. Moreover, it was also found that, in the case of the etching pressure of 700 Pa, the etch thickness increases with the elapse of the etching time, but it is saturated at an etching time of about 20 minutes in the case of the etching pressure of 100 Pa, and that the etching is not advanced any more even when the etching time is further extended. This clearly indicates that the etching pressure should be not less than 200 Pa and preferably 300 to 400 Pa or higher. The upper limit of the etching pressure is not set at any particular level. If the etching pressure is too high, however, it would be difficult to carry out uniform etching procedures since the use of an extremely high etching pressure makes it difficult to control the gas flow. For this reason, the etching pressure should be set at a level of not higher than 1,000 Pa and preferably not higher than about 700 Pa.

EXAMPLE 2

In this Example, using the same radical etching apparatus employed in Example 1, 5 slm, 10 slm or 15 slm of N$_2$ gas and 0.9 slm of NH$_3$ gas were fed to the pipe pathway of the apparatus through the gas introduction means 18, the electric power for applying μ waves was set at a level of 2.5 kW, and 0.8 slm of NH$_3$ gas and 1.0 slm of NF$_3$ gas were fed thereto through the gas introduction means 20.

Then a thermally deposited or formed oxide film or SiO$_2$ layer formed on a substrate S to be treated was removed through etching while the etching pressure was variously changed within the range of from 100 to 1,000 Pa, the etching time periods was set at 50 minutes and the amount of N$_2$ gas introduced into the pipe pathway of the apparatus through the gas introduction means 18 was likewise variously changed to thus determine the relation between the etching pressure (Pa) and the degree of etching of the SiO$_2$ layer (or etch thickness: nm). The results thus obtained are plotted on FIG. 5.

Figure 5:
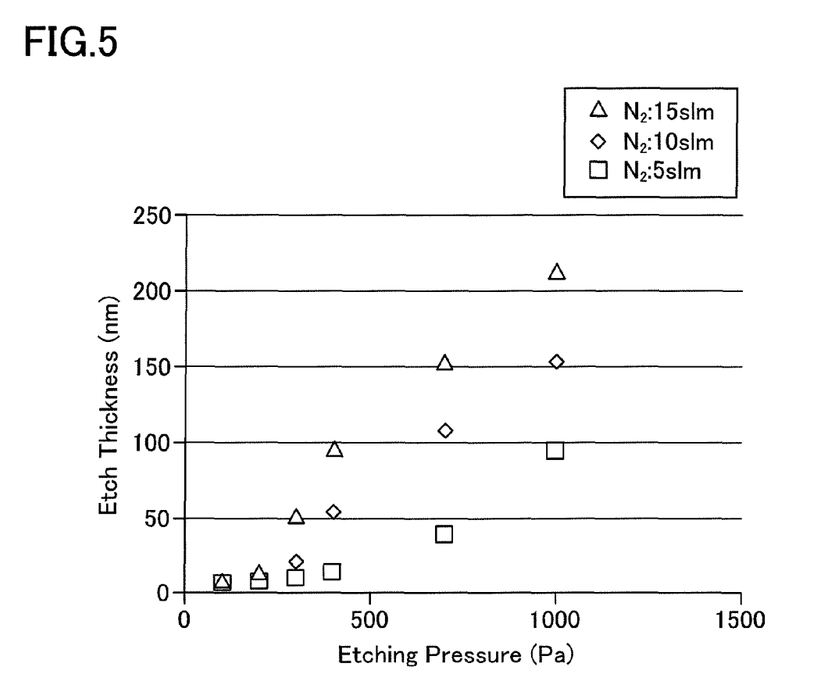
FIG. 5 is a graph showing the relation between the etching pressure (Pa) and the etching rate of $SiO_2$ (etch thickness (unit: nm)) observed at each predetermined flow rate of $N_2$ gas (slm) and obtained in Example 2.

The data plotted on FIG. 5 clearly indicates that, in the case of the N$_2$ gas flow rate of 10 slm, the etch thickness is abruptly increased at an etching pressure of 300 Pa or higher. Moreover, in the case of the N$_2$ gas flow rate of 15 slm, the etch thickness is more drastically increased as compared with that observed when the N$_2$ gas flow rate was set at 10 slm. Contrary to this, the etch thickness observed when the N$_2$ gas flow rate was set at 5 slm is moderately increased as compared with those observed for the cases in which the N$_2$ gas flow rate was set at 10 slm or 15 slm. Accordingly, the preferred lower limit of the etching pressure should be set at a level of 300 Pa.

The results as shown in FIGS. 4 and 5 indicate that the etching mode is changed or switched at an etching pressure of around 300 Pa. In addition, it was also found that the increase in the etch thickness is more conspicuous, as the etching pressure becomes higher and the N$_2$ gas flow rate is greater. More specifically, the etch thickness increases as the etching pressure increases, but as a matter of fact, the control of the gas flow becomes difficult when the etching pressure exceeds 1,000 Pa and therefore, it would be quite difficult to ensure any desired uniform etch thickness.

EXAMPLE 3

In this Example, using the same radical etching apparatus employed in Example 1, 10 slm of N$_2$ gas and 0.9 slm of NH$_3$ gas were fed to the pipe pathway of the apparatus through the gas introduction means 18, the electric power for applying μ waves was set at a level of 2.5 kW, and 0.8 slm of NH$_3$ gas and 1.0 slm of NF$_3$ gas were fed thereto through the gas introduction means 20.

Then a thermally deposited oxide film of SiO$_2$ formed on a substrate S to be treated was removed through etching while the etching time periods was set at 50 minutes, the etching pressure was variously changed within the range of from 100 to 1,000 Pa and the amounts of N$_2$ gas and NH$_3$ gas to be introduced into the pipe pathway of the apparatus through the gas introduction means 18 were likewise set at desired levels to thus determine the relation between the etching pressure (Pa) and the HF peak intensities (arbitrary unit) as determined according to the Qmass technique, observed during the etching of the thermally deposited oxide film of SiO$_2$. The results thus obtained are plotted on FIG. 6.

Figure 6:
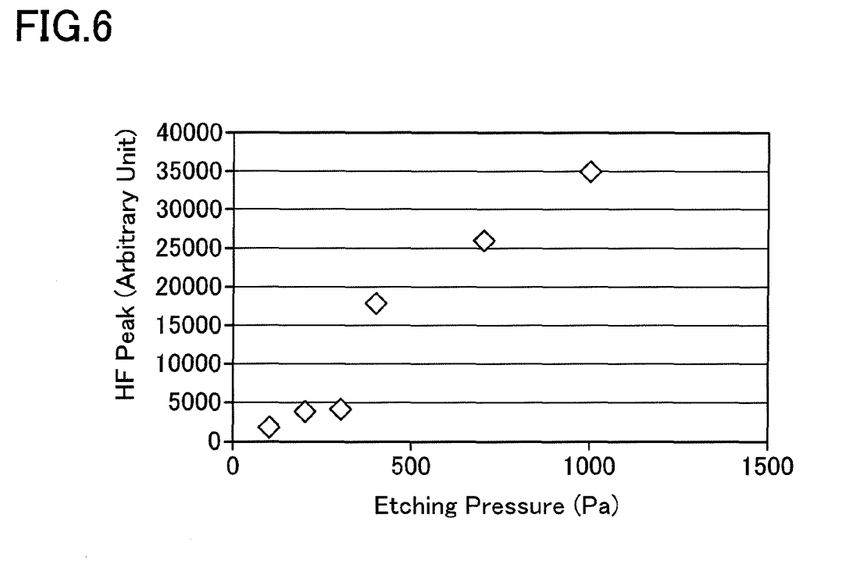
FIG. 6 is a graph showing the relation between the etching pressure (Pa) and the HF peaks (arbitrary unit) as observed in Example 3.

The data plotted on FIG. 6 clearly indicates that the HF peak is abruptly increased at an etching pressure of around 300 Pa. As will be clear from this result, it can be recognized that, if the etching pressure is less than 300 Pa, the thermally deposited oxide film of SiO$_2$ is etched according to the NF$_x$H$_y$ mode represented by the foregoing reaction formulas (1) to (3). Accordingly, in this case, the etching rate is low and the etching has such a tendency that it undergoes saturation with the elapse of etching time. On the other hand, it would be concluded that, if the etching pressure is not less than 300 Pa, the etching is not controlled or affected by the self-stopping effect and for this reason, the etching of the thermally deposited oxide film of $SiO_2$ is etched according to the HF mode represented by the foregoing reaction formulas (4) to (7). This would also be clear while taking into consideration, on the one hand, the fact that the etch thickness observed at an etching pressure of 100 Pa is saturated with respect to the etching time period and, the other hand, the results as shown in FIG. 4, which indicate that the etch thickness increases in proportion to the elapse of etching time at the etching pressure of 700 Pa. Accordingly, it can be concluded that the radical etching apparatus and method according to the present invention surely permit the high speed etching without being accompanied by any saturation thereof with the elapse of etching time.

Taking into account the results obtained in the foregoing Examples, the foregoing etching pressure should in general fall within the range of from 200 to 1,000 Pa, preferably 300 to 1,000 Pa and more preferably 400 to 700 Pa. As a whole, the method of the present invention can be carried out at an etching pressure falling within the foregoing range. As has been discussed above, there is such a tendency that the degree of etching (etch thickness) increases even at an etching pressure of not less than 1,000 Pa while taking into consideration only the etching rate. In this respect, there would be such a tendency that the uniformity of the etching gas flow cannot be ensured at such a high etching pressure and accordingly, the upper limit of the etching pressure is set at a level of 1,000 Pa, in the method of the present invention. However, it is a matter of course that, if any means for making the gas flow uniform can be adopted, the etching pressure can be set at a level of higher than 1,000 Pa.

EXAMPLE 4

In this Example, using the same radical etching apparatus employed in Example 1, $N_2$ gas in an amount ranging from 2 to 10 slm and 0.9 slm of $NH_3$ gas were fed to the pipe pathway of the apparatus through the gas introduction means 18, the electric power for applying μ waves was set at a level of 2.5 kW, and 0.8 slm of $NH_3$ gas and 1.0 slm of $NF_3$ gas were fed thereto through the gas introduction means 20.

Then a substrate S to be treated was etched while the etching time periods was set at 50 minutes, the etching pressure was set at a desired level on the order of 700 Pa, and the amount of $N_2$ gas was also changed within the range specified above to thus determine the relation between the quantity of the $N_2$ gas (flow rate: slm) introduced into the pipe pathway of the apparatus and the etch thicknesses (nm) of the thermally deposited oxide film ($SiO_2$ film) and the thermally deposited nitride film (SiN film) present on the substrate S to be treated. The results thus obtained are plotted on FIG. 7.

Figure 7:
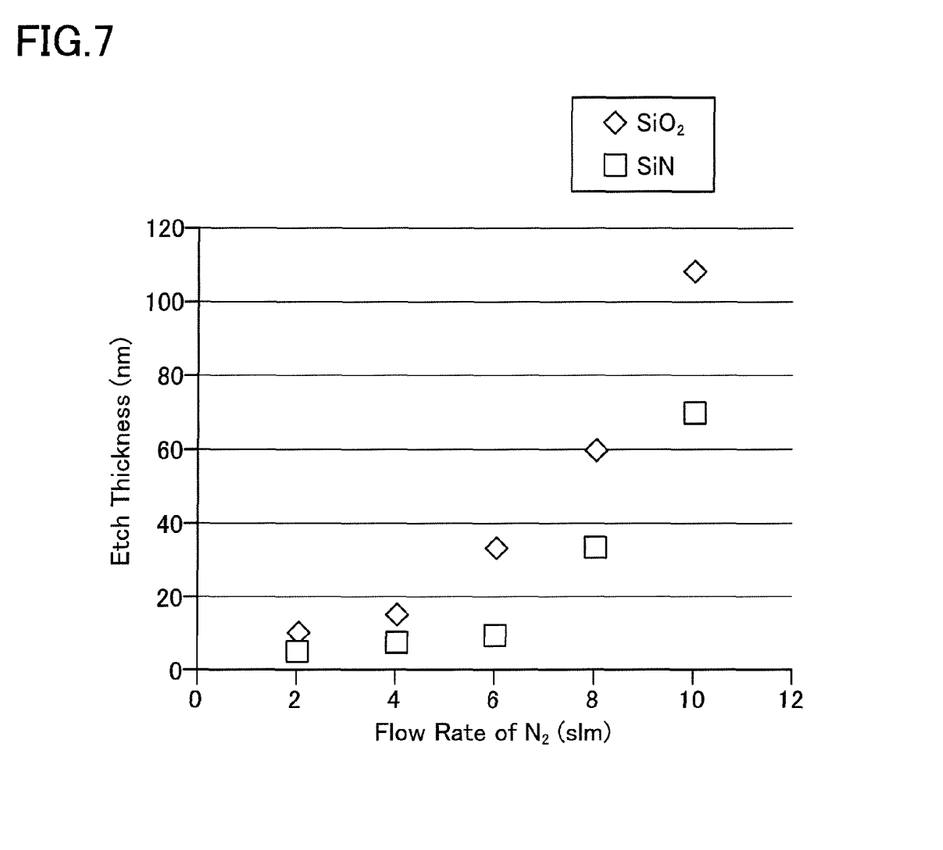
FIG. 7 is a graph showing the relation between the flow rate of $N_2$ gas (slm) and the etching rate (etch thickness (unit: nm)) observed in Example 4 for $SiO_2$ films and thermally deposited-nitride films (SiN films).

Regarding the $SiO_2$ film, the data plotted on FIG. 7 clearly indicates that the etch thickness begins to abruptly increase at an $N_2$ gas flow rate of around 5 slm. This is because, H radicals reach the point, at which the gas introduction means 20 and the pipe pathway 17 are connected together, as the $N_2$ gas flow rate is increased. As a result, the H radicals thus undergo a direct reaction with $NF_3$ gas and the HF-generating efficiency is correspondingly improved. In this respect, it has been supposed that, if the $N_2$ gas flow rate is low, the H radicals and H ions generated within the plasma are disappeared in the course of the transportation of these radicals and ions and they are converted into or transported in the form of $N_2H$ and $N_3H$. This accordingly results in a reduced efficiency of the reaction thereof with $NF_3$ gas and likewise a reduced quantity of HF generated. However, F is also generated in this case and there would be a high possibility of increasing the etch thickness of a thermally deposited nitride film or SiN film. For this reason, the etching mode to be used can be selected from the group consisting of the $NF_xH_y$ etching mode, the HF etching mode and the combination of these two etching modes, depending on whether, or not, the etching method makes use of the conditions which permit the direct reaction of H radicals and/or H ions with $NF_3$ gas. In this connection, in the case of the $NF_xH_y$ etching mode, any SiN film is not etched at all, but it would be apprehended that SiN films are also etched in the case of the HF etching mode.

Industrial Applicability

According to the present invention, there are provided a radical etching apparatus and a method therefor, which permit the etching of even a thick film (for instance, those having a thickness of not less than 100 nm) at a high etching speed. Accordingly, a thick film present on a substrate to be treated such as a naturally occurring oxide film can be removed through etching at a high speed. The apparatus and method of the present invention can thus be used in the steps for manufacturing semiconductor devices such as Si transistors. Consequently, the radical etching apparatus and method according to the present invention can effectively be applied to, for instance, the semiconductor device-manufacturing industries.

BRIEF DESCRIPTION OF THE SYMBOLS

1, 2 radical etching apparatus; 11 vacuum evacuation system; 12 vacuum chamber; 12a side wall;
13 boat; 14 substrate-charging and withdrawing chamber;
15a, 15b gate valve; 16 shower plate;
17 pipe pathway; 18, 20, 21 gas introduction means;
19 microwave (μ waves) application means; S . . . substrate to be treated (Si wafer)

What is claimed is:

1. A radical etching method characterized in that it comprises the steps of: introducing $N_2$ gas and at least one member selected from the group consisting of $H_2$ gas and $NH_3$ gas into a pipe pathway provided with a zone in which plasma is to be generated; applying microwaves to the gas mixture within the zone so that plasma is thus generated and that the gas mixture is decomposed by the action of the plasma to thus form decomposition products as active species; irradiating the decomposition products with a gas as a source of supply for F in the middle of the transportation of the decomposition products to a vacuum chamber so that the products undergo a reaction with the source of supply for F thereby generating HF radicals and subjecting an $SiO_2$ layer formed on a substrate to be treated, which has been placed within the vacuum chamber, to radical etching by irradiating the substrate with the HF radicals through a shower plate arranged within the chamber,
wherein the etching reaction is exclusively caused by the action of the HF radicals, while the ratio of the etch selectivity of a thermally deposited-nitride film to that of a thermally deposited-oxide film or an $SiO_2$ film is not higher than 1.0.

2. The radical etching method as set forth in claim 1, wherein the gas as the source of supply for F is at least one member selected from the group consisting of $NF_3$ gas, HF gas and $F_2$ gas.

3. The radical etching method as set forth in claim 2, wherein the decomposition products comprise H radicals and H ions.

4. The radical etching method as set forth in claim 1, wherein the decomposition products comprise H radicals and H ions.

* * * * *